US008817566B2

(12) United States Patent
Shin et al.

(10) Patent No.: US 8,817,566 B2
(45) Date of Patent: Aug. 26, 2014

(54) MEMORY SYSTEM

(75) Inventors: Sang Hoon Shin, Icheon-si (KR);
 Hyung Dong Lee, Icheon-si (KR);
 Jeong Woo Lee, Icheon-si (KR); Young Suk Moon, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 202 days.

(21) Appl. No.: 13/340,868

(22) Filed: Dec. 30, 2011

(65) Prior Publication Data

US 2013/0094316 A1 Apr. 18, 2013

(30) Foreign Application Priority Data

Oct. 18, 2011 (KR) ........................ 10-2011-0106416

(51) Int. Cl.
 *G11C 7/00* (2006.01)
 *G11C 11/406* (2006.01)

(52) U.S. Cl.
 CPC .... *G11C 11/40603* (2013.01); *G11C 11/40615* (2013.01); *G11C 11/40611* (2013.01)
 USPC ........................................ 365/222

(58) Field of Classification Search
 USPC ........................................ 365/222
 See application file for complete search history.

(56) References Cited

U.S. PATENT DOCUMENTS

| | | | | |
|---|---|---|---|---|
| 6,310,814 B1* | 10/2001 | Hampel et al. | ................ | 365/222 |
| 6,914,841 B1* | 7/2005 | Thwaite | ........................ | 365/222 |
| 2002/0176302 A1* | 11/2002 | Jung et al. | ..................... | 365/222 |
| 2005/0083752 A1* | 4/2005 | Lee et al. | ...................... | 365/222 |
| 2005/0108460 A1* | 5/2005 | David | ............................. | 711/5 |
| 2005/0133852 A1* | 6/2005 | Shau | ............................. | 257/315 |
| 2005/0166009 A1* | 7/2005 | Proebsting | .................... | 711/106 |
| 2005/0226074 A1* | 10/2005 | Yang et al. | ..................... | 365/222 |
| 2005/0276142 A1* | 12/2005 | Pelley | ........................... | 365/222 |
| 2007/0121420 A1* | 5/2007 | Lee | ............................. | 365/233.5 |
| 2008/0137464 A1* | 6/2008 | Kim | ............................. | 365/222 |
| 2010/0097874 A1* | 4/2010 | Hoffmann | ..................... | 365/222 |
| 2011/0051528 A1* | 3/2011 | Kim | ......................... | 365/189.04 |

* cited by examiner

*Primary Examiner* — Hoai V Ho
*Assistant Examiner* — Pablo Huerta
(74) *Attorney, Agent, or Firm* — William Park & Associates Ltd.

(57) ABSTRACT

A memory system includes: a controller configured to provide a hidden auto refresh command; and a memory configured to perform a refresh operation in response to the hidden auto refresh command. The controller and the memory communicate with each other so that each refresh address of the controller and the memory has the same value as each other.

26 Claims, 7 Drawing Sheets

MEMORY SYSTEM

CROSS-REFERENCES TO RELATED APPLICATION

The present application claims priority under 35 U.S.C. §119(a) to Korean application number 10-2011-0106416, filed on Oct. 18, 2011, in the Korean Intellectual Property Office, which is incorporated herein by reference in its entirety.

BACKGROUND

1. Technical Field

The present invention relates generally to a semiconductor memory, and more particularly to a memory system.

2. Related Art

A semiconductor memory (hereafter, referred to as a memory) stores data in a cell capacitor. That is, the cell capacitor can be either charged or discharged so as to store data in the cell capacitor. However, since the capacitor leaks charge, a refresh operation of sensing and amplifying the data and rewriting the amplified data is required.

Figure 1:
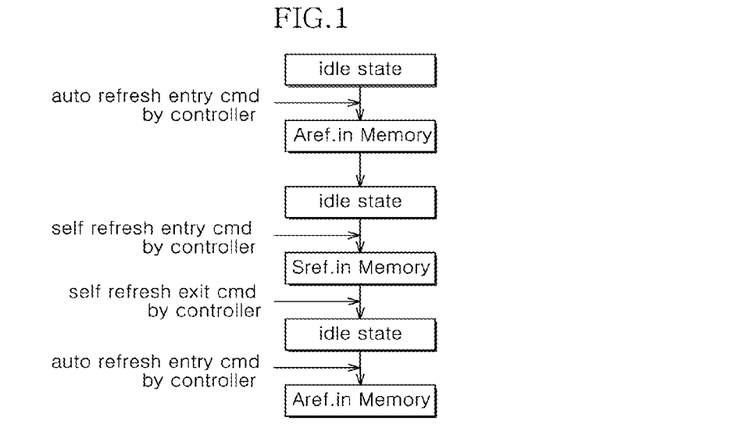
FIG. 1 is a flow chart showing a known refresh method.

Referring to FIG. 1, a known memory performs a refresh operation in response to a command provided by a controller for controlling the operation of the memory, such as a central processing unit (CPU) or graphic processing unit (GPU). The command may include an auto refresh entry command, a self refresh entry command, and a self refresh exit command.

The known memory cannot be accessed during an auto refresh operation period as well as a self refresh operation period. Therefore, an effective band width of the memory may be reduced.

SUMMARY

A memory system capable of increasing an effective bandwidth is described herein.

In one embodiment of the present invention, a memory system includes: a controller configured to provide a hidden auto refresh command; and a memory configured to perform a refresh operation in response to the hidden auto refresh command. The controller and the memory communicate with each other to update refresh addresses thereof to the same value.

In another embodiment of the present invention, a memory system includes: a controller configured to generate a command signal obtained by decoding signals including a hidden auto refresh command, a self refresh command, and an address synchronization command, and update a first refresh address to the same value as a second refresh address provided from outside; a memory configured to perform auto refresh according to the first refresh address in response to the hidden auto refresh command, perform self refresh according to the internally-counted second refresh address in response to the self refresh command, and update the second refresh address to the same value as the first refresh address; and a communication channel coupled between the controller and the memory and configured to transmit the command signal, the first refresh address, and the second refresh address.

In another embodiment of the present invention, a memory system includes: a memory including a plurality of unit memory blocks one-to-one allocated to a plurality of refresh address counters and configured to perform a refresh operation on the plurality of unit memory blocks in response to a hidden auto refresh command; and a controller configured to count a plurality of refresh addresses corresponding to the plurality of refresh address counters and provide the refresh addresses and the hidden auto refresh command to the memory. The memory and the controller communicate with each other to update refresh addresses thereof to the same value.

In another embodiment of the present invention, a memory system includes: a memory including a plurality of unit memory blocks sharing one refresh address counter and configured to perform a refresh operation on the plurality of unit memory blocks in response to an auto refresh command or a self refresh command; and a controller configured to provide the hidden auto refresh command or the self refresh command to the memory, and adjust refresh addresses corresponding to the respective unit memory blocks to the same value while the hidden auto refresh command is provided. The memory and the controller communicate with each other to update refresh addresses thereof to the same value.

BRIEF DESCRIPTION OF THE DRAWINGS

Features, aspects, and embodiments are described in conjunction with the attached drawings, in which.

DETAILED DESCRIPTION

Hereinafter, a semiconductor system according to the present invention will be described below with reference to the accompanying drawings through exemplary embodiments.

Figure 2:
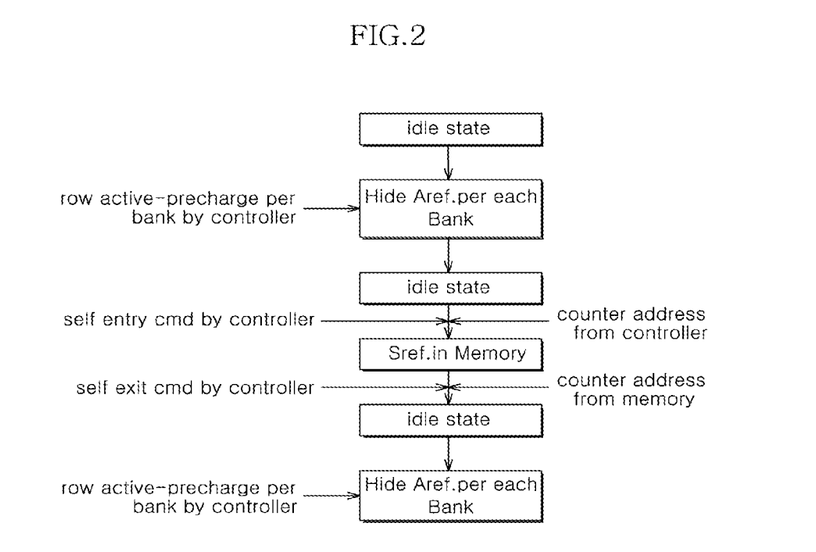
FIG. 2 is a flow chart showing a refresh method according to an embodiment of the present invention.

Referring to FIG. 2, a refresh method according to an embodiment of the present invention will be described.

In an embodiment of the present invention, hidden auto refresh (Hide Aref) is used to increase an effective bandwidth of a memory.

Furthermore, the memory and a controller for controlling the operation of the memory, such as a CPU or GPU, may synchronize their refresh addresses to improve the stability of a refresh operation. For example, the memory and a controller manage their refresh such that each of the memory and the controller has the same refresh address, thereby improving the stability of a refresh operation.

Referring to FIG. 2, the hidden auto refresh will be described. During the hidden auto refresh, the controller does not provide a separate auto refresh command to the memory, but activates an auto refresh operation by commanding a row active-precharge operation during a normal operation.

The hidden auto refresh does not provide a separate auto refresh command having an operation period discriminated from a normal operation period, but commands a row active-precharge operation within the normal operation period. Therefore, an access time for normal operation may increase.

In addition, the row active-precharge operation as the hidden auto refresh uses a 'CAS before RAS method' (CBR) in which a column access strobe (CAS) signal is activated before a row access strobe (RAS) signal is activated, such that the memory may discriminate the hidden auto refresh operation and a normal active-precharge operation.

The memory performs a refresh operation in response to row-active precharge command and a refresh address. The row-active precharge command is used as a command for the hidden auto refresh and the refresh address may be transmitted with the row-active precharge command. The hidden auto refresh operation may be performed on each memory bank.

Also, the controller provides a self refresh entry command and a self refresh exit command to the memory at a predetermined timing.

When the controller provides a self refresh entry command to the memory, the controller also provides a refresh address stored in its refresh address counter to the memory.

Therefore, the memory performs a self refresh operation according to the refresh address provided by the controller. Here, the self refresh operation may be performed on each memory bank.

Furthermore, the memory provides a refresh address stored in its refresh address counter to the controller, in response to the self refresh exit command.

According to the above-described method, the hidden auto refresh and the self refresh are performed in a predetermined order.

According to the known refresh operation, the memory performs a self refresh operation according to a refresh address generated thereby regardless of an address provided from the controller, during the auto refresh operation. The controller also provides its own refresh address to the memory regardless of the refresh address at which the self refresh was performed by the memory, in order to perform the auto refresh.

In an embodiment of the present invention, however, the memory may recognize which address has been accessed for the hidden auto refresh, according to the refresh address provided by the controller. The controller may also recognize which address has been accessed for the self refresh, according to the refresh address provided by the memory.

Figure 3:
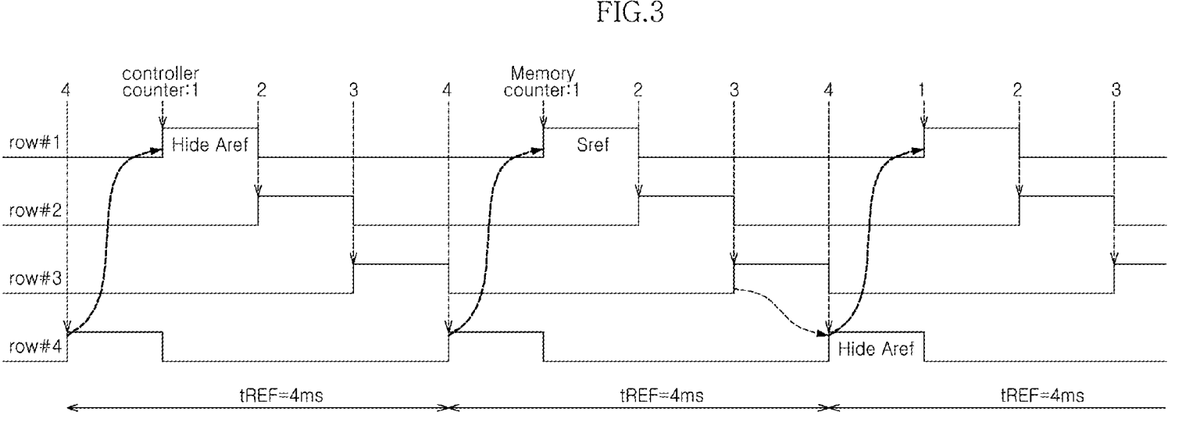
FIG. 3 is a refresh timing diagram based on FIG. 2.

Referring to FIG. 3, when it is assumed that the memory includes four row addresses, the controller receives a refresh address corresponding to a row address row#3 from the memory, and then provides a hidden auto refresh command corresponding to a row address row#4 to the memory.

Therefore, the memory may perform a hidden refresh operation on the next row address row#4 after the previous self refresh operation was performed.

According to the related art under the same situation, since the controller has already command the hidden auto refresh up to the row address row#4 at the previous step, the controller will provide a hidden auto refresh command corresponding to a row address row#1 to the memory at the next step. In this case, a refresh performance period for the row address row#4 may exceed the refresh specification (tREF=4 ms), and corresponding cell data may be lost.

In an embodiment of the present invention, however, the self refresh and the hidden auto refresh are performed on the next row address to a row address at which refresh was finally performed. Therefore, a probability of cell data loss may be reduced.

In the above-described refresh method, a case in which refresh address counters and predetermined unit memory blocks (for example, memory banks) are in a one-to-one correspondence was taken as an example.

Hereinafter, a memory system 100 configured to perform refresh according to an embodiment of the present invention will be described with reference to FIG. 4.

Figure 4:
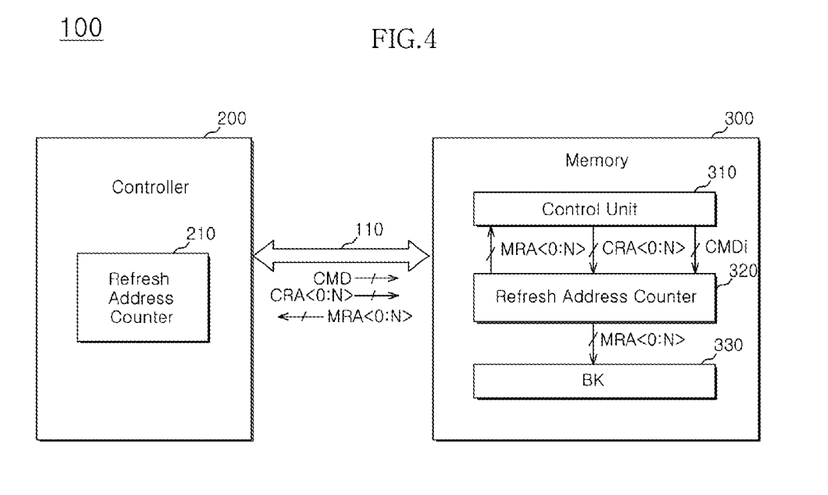
FIG. 4 is a block diagram of a memory system according to an embodiment of the present invention.

Referring to FIG. 4, the memory system 100 according to an embodiment of the present invention includes a controller 200 configured to provide a hidden auto refresh command and a memory 300 configured to perform a refresh operation in response to a hidden auto refresh command. The controller 200 and the memory 300 communicate with each other to synchronize their refresh addresses. For example, the controller 200 and the memory 300 communicate with each other so as to manage their refresh addresses such that each of the memory and the controller has the same refresh address.

The memory system 100 further includes a communication channel 110 through which the controller 200 and the memory 300 transmit various commands and the refresh addresses.

The controller 200 is configured to generate a command signal CMD and a first refresh address CRA<0:N> and provide the generated signals to the memory 300. The command signal CMD may include a signal obtained by decoding a hidden auto refresh command, a self refresh command, or an address synchronization command.

Here, the self refresh command may include a self refresh entry command and a self refresh exit command.

The controller 200 is configured to transmit the command signal CMD to the memory 300 through the communication channel 110.

The controller 200 is configured to synchronize a second refresh address MRA<0:N> provided from outside with the first refresh address CRA<0:N>. For example, the controller 200 is configured to manage a second refresh address MRA<0:N> provided from outside such that the second refresh address MRA<0:N> is identical to the first refresh address CRA<0:N>. For example, the value of the first refresh address CRA<0:N> is adjusted to the same value as the second refresh address MRA<0:N>.

The hidden auto refresh command is performed by commanding a row active-precharge operation within a normal operation period. The row active-precharge according to the hidden auto refresh may be defined by the CBR method, that is, defined by activating a CAS signal before a RAS signal.

The controller 200 includes a refresh address counter 210 configured to count the first refresh address CRA<0:N>.

The memory 300 is configured to perform a hidden auto refresh operation corresponding to the first refresh address CRA<0:N> in response to the hidden auto refresh command, and perform a self refresh operation corresponding to the internally-counted second refresh address MRA<0:N> in response to the self refresh entry command.

The memory 300 is configured to synchronize the second refresh address MRA<0:N> with the first refresh address CRA<0:N> provided from outside. For example, the memory 300 is configured to manage the second refresh address MRA<0:N> such that the second refresh address MRA<0:N> is identical to the first refresh address CRA<0:N> provided from outside. For example, the second refresh address MRA<0:N> is adjusted to the same value as the first refresh address CRA<0:N>.

The memory 300 is configured to provide the second refresh address MRA<0:N> to the controller 200 in response to the self refresh exit command.

The memory 300 includes a unit memory block, that is, a memory bank (BK) 330, a refresh address counter 320, and a control unit 310.

Here, the memory bank 330 is only an example of various storage units, that is, may include one or more of various storage units.

The refresh address counter 320 is configured to count the second refresh address MRA<0:N> in response to an internal command signal CDMi and synchronize the second refresh address MRA<0:N> with the first refresh address CRA<0:N> provided from outside. For example, the refresh address counter 320 is configured to manage the second refresh address MRA<0:N> such that the second refresh address MRA<0:N> is identical to the first refresh address CRA<0:N> provided from outside.

The control unit 310 is configured to generate the internal command signal CMDi by decoding the command signal CMD provided from the controller 200, provide the first refresh address CRA<0:N> to the refresh address counter 320, and perform various control operations including an operation of transmitting the second refresh address MRA<0:N> to the controller 200.

Here, the internal command signal CMDi may include the hidden auto refresh command, the self refresh entry command, the self refresh exit command, and an address synchronization command ADDSYNC.

The communication channel 110 includes a data line, an address line, a command signal line, and a data mask signal line. Furthermore, the communication channel 110 may additionally include a refresh address dedicated line or/and an address synchronization command dedicated line.

In addition, the refresh address counter 210 of the controller 200 and the refresh address counter 320 of the memory 300 may be configured in the same manner.

Figure 5:
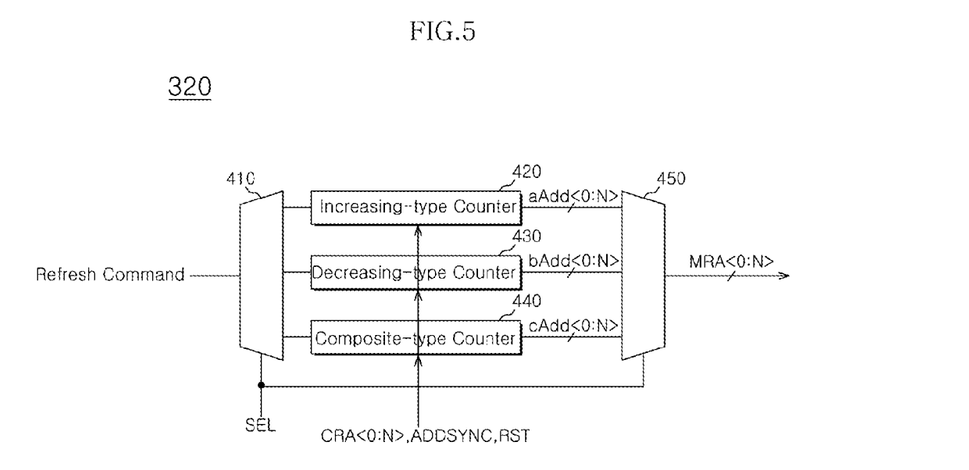
FIG. 5 is a block diagram illustrating the internal configuration of a refresh address counter of FIG. 4.

Referring to FIG. 5, the refresh address counter 320 is configured to deal with various counting methods.

The counting methods may be divided into an increasing type, a decreasing type, and a composite type. The composite type may include two or more types (for example, the increasing type+a grey code type). In an embodiment of the present invention, the refresh address counter 320 includes an increasing-type counter 420, a decreasing-type counter 430, and a composite-type counter 440. Furthermore, the refresh address counter 320 may include a demultiplexer 410 and a multiplexer 450 to select one from the counters.

The demultiplexer 450 is configured to provide a refresh command, that is, a hidden auto refresh command or self refresh entry command to any one of the increasing-type counter 420, the decreasing-type counter 430, and the composite-type counter 440, in response to a select signal SEL.

Here, the value of the select signal SEL may be set by using a test mode, a fuse set, or a mode register set (MRS).

The multiplexer 410 is configured to select any one signal among a plurality of signals, i.e., output signals of the increasing-type counter 420, the decreasing-type counter 430, and the composite-type counter 440 in response to the select signal SEL, and output the selected signal as the second refresh address MRA<0:N>.

The increasing-type counter 420, the decreasing-type counter 430, and the composite-type counter 440 are configured to perform a counting operation according to their own counting methods in response to the refresh command, and generate pre-address signals aADD<0:N>, bADD<0:N>, and cADD<0:N>, respectively.

The increasing-type counter 420, the decreasing-type counter 430, and the composite-type counter 440 receive the first refresh address CRA<0:N> and output the second refresh address MRA<0:N> in response to the address synchronization command ADDSYNC.

The increasing-type counter 420, the decreasing-type counter 430, and the composite-type counter 440 reset the pre-address signals aADD<0:N>, bADD<0:N>, and cADD<0:N>, respectively, in response to a reset signal RST.

Figure 6:
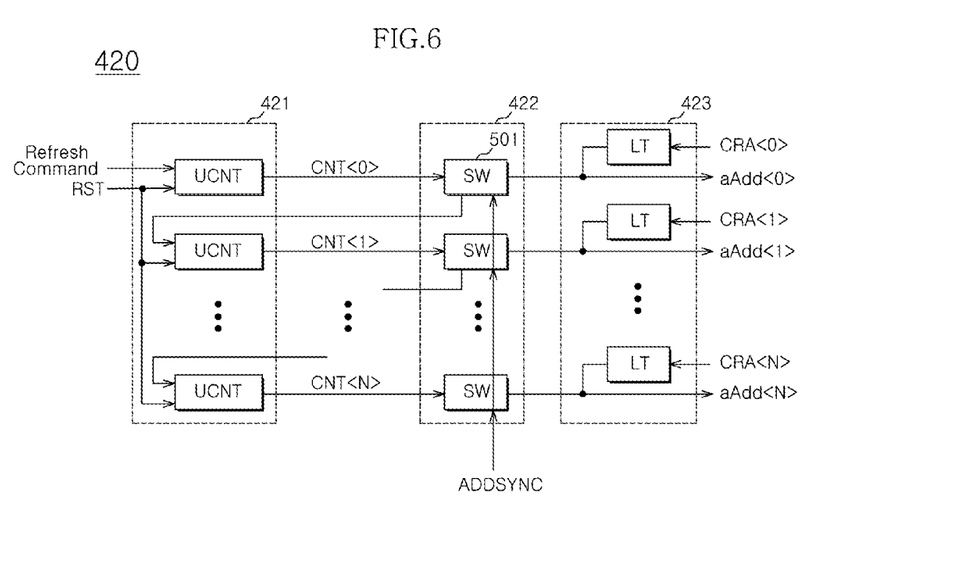
FIG. 6 is a block diagram of an increasing-type counter of FIG. 5.

Referring to FIG. 6, the increasing-type counter 420 includes a counting logic 421, an address synchronization section 422, and a latch array 423.

The counting logic 421 includes a plurality of unit counters UCNT configured to receive the refresh command and the reset signal RST and generate a plurality of unit count signals CNT<0:N>.

The address synchronization section 422 includes a plurality of switches SW configured to provide the unit count signals CNT<0:N> or the first refresh address CRA<0:N> to the counting logic 421 and also output the unit count signals CNT<0:N> or the first refresh address CRA<0:N> as the pre-address signal aADD<0:N>, in response to the address synchronization command ADDSYNC.

The latch array 423 includes a plurality of latches LT configured to latch the first refresh address CRA<0:N> and provide the latched address to the address synchronization section 422.

The decreasing-type counter 430 and the composite-type counter 440 may be configured in the same manner as the increasing-type counter 420, except for the configuration of the counting logic 421.

Figure 7:
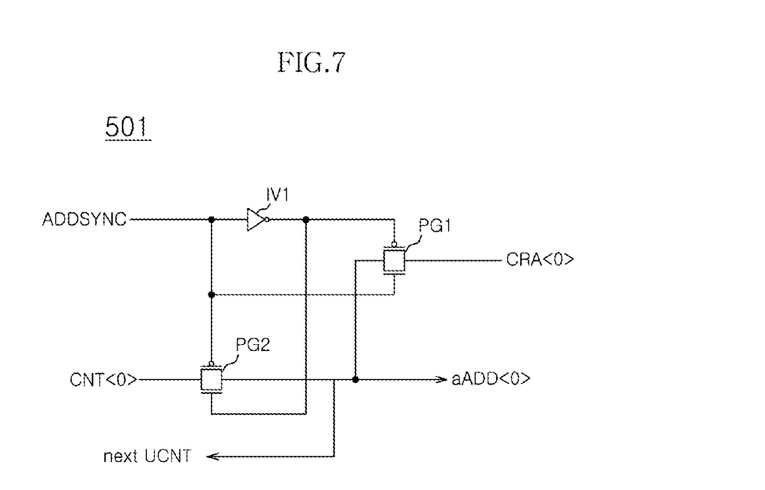
FIG. 7 is a circuit diagram of a switch of FIG. 6.

Referring to FIG. 7, one switch 501 among the plurality of switches SW includes an inverter IV1 and pass gates PG1 and PG2.

When the address synchronization command ADDSYNC is activated to a logic high level, the pass gate PG1 of the switch 501 receives the first refresh address CRA<0> and transmits the first refresh address CRA<0> to the next unit counter UCNT. Also, the pass gate PG1 outputs the first refresh address CRA<0> as the pre-address signal aADD<0>.

When the address synchronization command ADDSYNC is deactivated to a logic low level, the pass gate PG2 of the switch 501 receives the unit count signal CNT<0> and transmits the unit count signal CNT<0> to the next counter UCNT. Also, the pass gate PG2 outputs the unit count signal CNT<0> as the pre-address signal aADD<0>.

Figure 8:
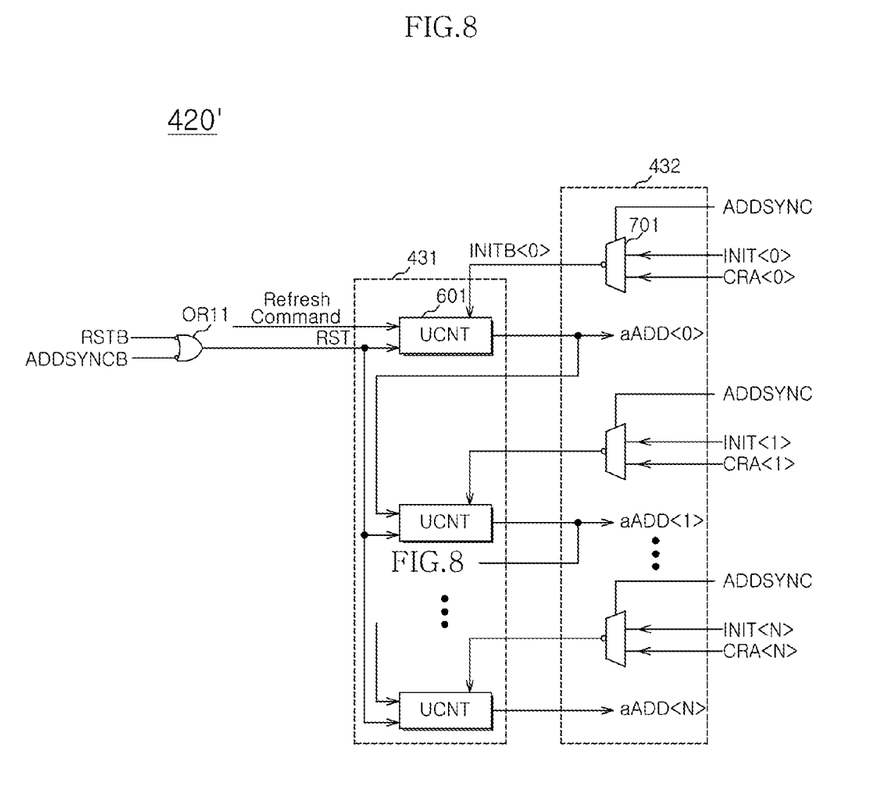
FIG. 8 is a block diagram of another example of the increasing-type counter of FIG. 5.

The increasing-type counter 420 of FIG. 5 may be configured in such a form as illustrated in FIG. 8.

The increasing-type counter 420' includes an OR gate OR11, a counting logic 431, and an address synchronization section 432.

The OR gate OR11 is configured to activate the reset signal RST when any one of a reset bar signal RSTB and an address synchronization bar command ADDSYNCB is activated to a logic low level.

The counting logic 431 includes a plurality of unit counters UCNT configured to receive initial value bar information INITB<0:N> in response to the reset signal RST and generate the pre-address signal aADD<0:N> by counting the initial value bar information INITB<0:N> in response to the refresh command.

The address synchronization section 432 includes a plurality of multiplexers 701 configured to invert one of initial value information INIT<0:N> and the first refresh address CRA<0:N> and output the inverted signal as the initial value bar information INITB<0:N> in response to the address synchronization command ADDSYNC.

The address synchronization section 432 inverts the first refresh address CRA<0:N> and outputs the inverted signal as the initial value bar information INITB<0:N>, when the address synchronization command ADDSYNC is activated.

The address synchronization section 432 inverts the initial value information INIT<0:N> and outputs the inverted signal as the initial value bar information INITB<0:N>, when the address synchronization command ADDSYNC is deactivated.

In short, the increasing-type counter 420' resets the pre-address signal aADD<0:N> using the preset initial value information INIT<0:N>, during a normal reset operation, that is, when the reset bar signal RSTB is activated.

Furthermore, the increasing-type counter 420' resets the pre-address signal aADD<0:N> to the first refresh address CRA<0:N> instead of the preset initial value information INIT<0:N>, during the address synchronization operation, that is, when the address synchronization command ADDSYNC is activated.

Figure 9:
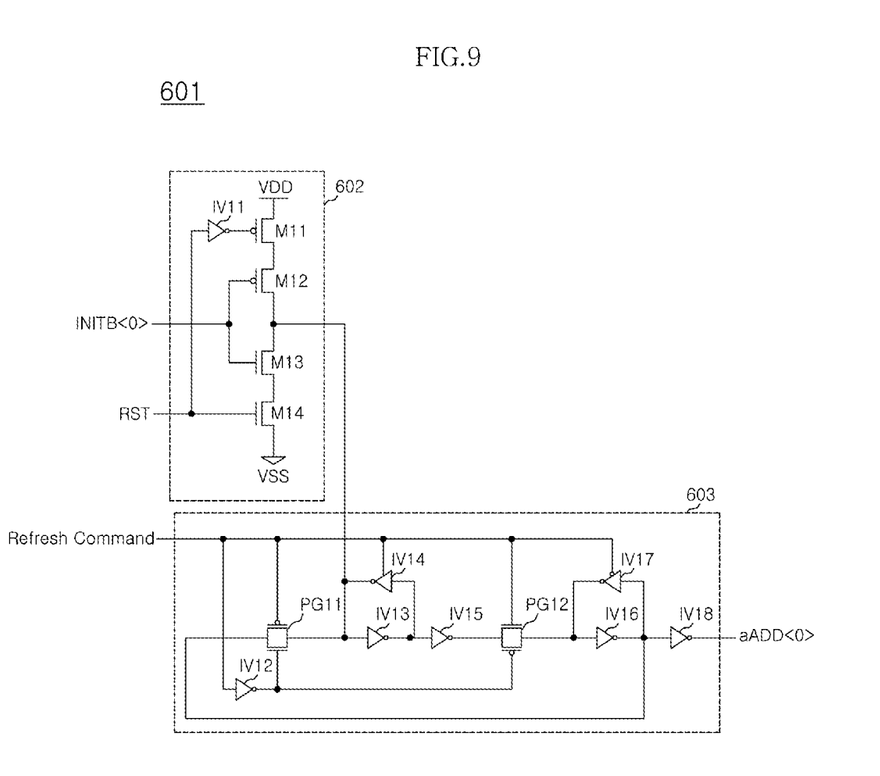
FIG. 9 is a circuit diagram of a unit counter of FIG. 8.

Referring to FIG. 9, the unit counter 601 includes an initial value setting section 602 and a flip-flop 603.

The initial value setting section 602 includes an inverter IV11 and a plurality of transistors M11 to M14.

The initial value setting section 602 is configured to invert the initial value bar information INITB<0:N> and store the inverted signal in the flip-flop 603, when the reset signal RST is activated.

The flip-flop 603 includes a plurality of inverters IV12 to IV18 and a plurality of pass gates PG11 and PG12.

In the memory system 100 according to an embodiment of the present invention, a case in which the refresh address counter and each unit memory block (for example, memory bank) are in a one-to-one correspondence is taken as an example.

In the above-described embodiment, when the memory and the controller use dedicated signal lines for transmitting their refresh addresses, a separate address synchronization command is not required.

A refresh method according to an embodiment of the present invention enables a plurality of unit memory blocks (for example, memory banks) to share one refresh address counter.

In the refresh method according to an embodiment of the present invention, a hidden auto refresh operation is used, and a controller and a memory may synchronize their refresh addresses in the same manner as the embodiment described with reference to FIGS. 2 to 9.

In the refresh method according to an embodiment of the present invention, the controller synchronize auto refresh addresses of all memory banks with the same row address, and then transmits the corresponding address to the memory.

As such, the memory performs a hidden auto refresh operation and a self refresh operation according to the refresh address transmitted from the controller, and transmits the refresh address to the controller when the self refresh operation is ended.

Hereinafter, a memory system 101 configured to perform the refresh according to an embodiment of the present invention will be described with reference to FIG. 10.

Figure 10:
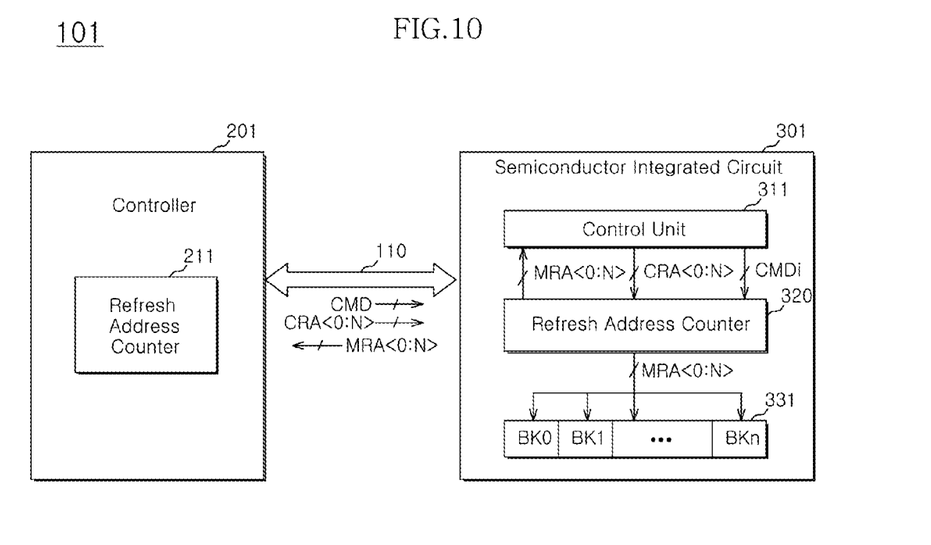
FIG. 10 is a block diagram of a memory system according to an embodiment of the present invention.

Referring to FIG. 10, the memory system 101 according to an embodiment of the present invention includes a controller 201, a memory 301, and a communication channel 110.

The controller 201 may be configured in the same manner as the controller 200 of FIG. 4, except that the controller 201 synchronizes auto refresh addresses of a plurality of memory banks 331 with the same row address and then transmits the corresponding address to the memory 301.

The memory 301 includes a control unit 311, a refresh address counter 320, and a plurality of memory banks 331. A second refresh address MRA<0:N> outputted from the refresh address counter 320 is commonly inputted to the memory banks 331.

That is, the plurality of memory banks 331 share one refresh address counter 320.

Figure 11:
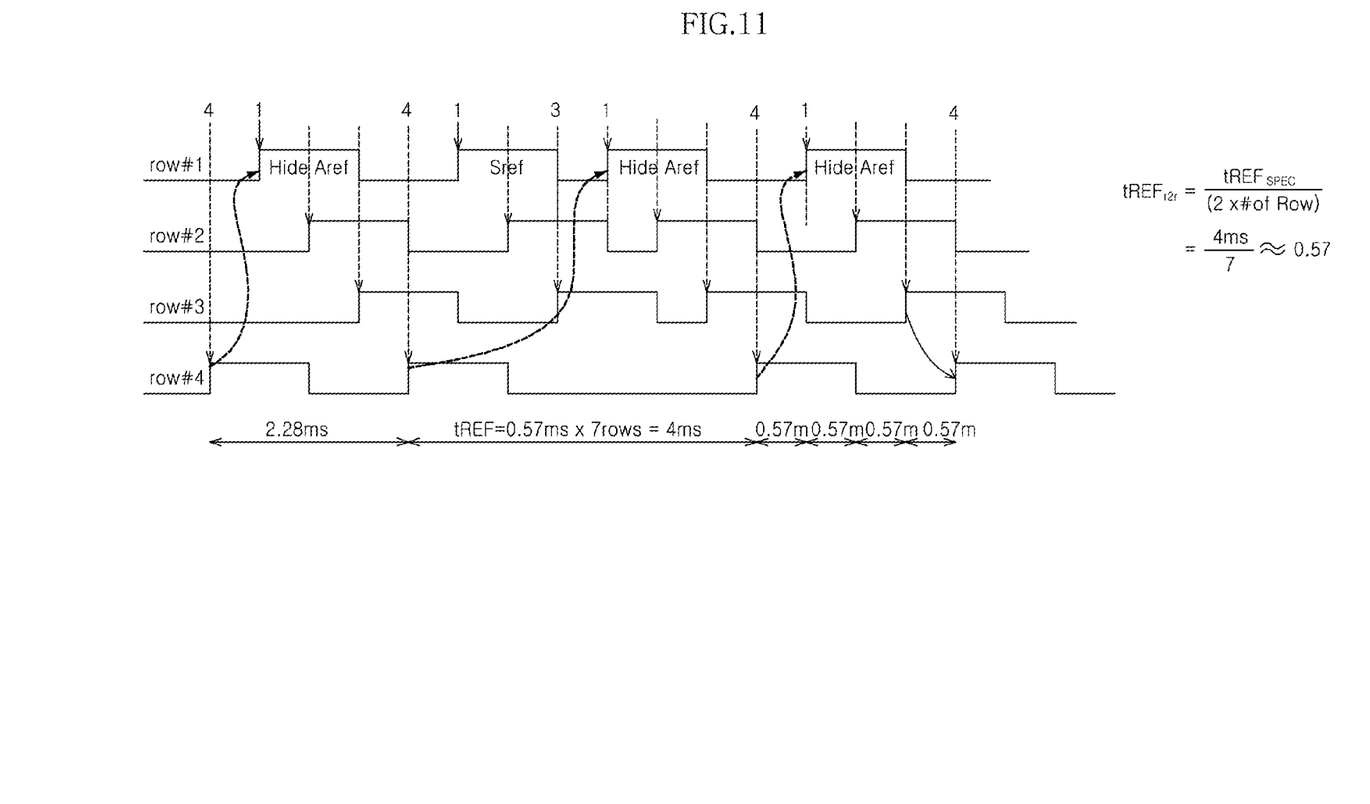
FIG. 11 is a refresh timing diagram according to an embodiment of the present invention.

In addition, a memory system according to an embodiment of the present invention, which uses the hidden auto refresh method but does not use refresh address synchronization, will be described with reference to FIG. 11.

The memory system according to an embodiment of the present invention is implemented to increase an effective bandwidth of a memory. In order to implement the memory system, various embodiments have been described with reference to FIGS. 2 to 10.

However, the memory systems according to the above-described embodiments include additional hardware and software components, but the memory system according to an embodiment of the present invention is implemented to minimize the number of additional hardware and software components.

A basic operation principle of the memory system is that the refresh period thereof is set to be smaller than the specification tREF_spec. For example, the refresh period may be set to (tREF_spec)/((2*row address number−1)).

When this method is used, the controller and the memory do not synchronize the refresh addresses. Therefore, the self refresh and the hidden auto refresh are performed on independent refresh addresses.

Any one of the self refresh and the hidden auto refresh is performed on all row addresses within the refresh period, that is, (tREF_spec)/((2*row address number−1)).

Therefore, the bandwidth of the memory may increase, and simultaneously, the refresh may be performed stably. For this operation, the design of the circuit block for generating the refresh period may need to be changed.

According to the embodiments of the present invention, it is possible to increase an effective bandwidth and perform stable refresh.

While certain embodiments have been described above, it will be understood to those skilled in the art that the embodiments described are by way of example only. Accordingly, the memory system described herein should not be limited based on the described embodiments. Rather, the memory system described herein should only be limited in light of the claims that follow when taken in conjunction with the above description and accompanying drawings.

What is claimed is:

1. A memory system comprising:
   a controller configured to provide a hidden auto refresh command; and
   a memory configured to perform a refresh operation in response to the hidden auto refresh command,
   wherein, the controller is configured to update a value of a first refresh address to a same value of a second refresh address, and provide the first refresh address to the memory before starting the refresh operation of the memory, and
   the memory is configured to provide the second refresh address changed its value by completion of the refresh operation.

2. The memory system according to claim 1, wherein the hidden auto refresh command is performed by commanding a row active-precharge operation.

3. The memory system according to claim 1, wherein the controller and the memory comprise refresh address counting logics configured in the same manner.

4. The memory system according to claim 1, wherein the memory comprises a refresh address counter which includes a plurality of counters having different types of counting logics, and is configured to selectively operate any one of the counters.

5. A memory system comprising:
a controller configured to generate a command signal obtained by decoding signals including a hidden auto refresh command, a self refresh command, and an address synchronization command, and update a first refresh address so that the first refresh address has the same value as a second refresh address provided from outside;
a memory configured to perform auto refresh according to the first refresh address in response to the hidden auto refresh command, perform self refresh according to the internally-counted second refresh address in response to the self refresh command, and update the second refresh address so that the second refresh address has the same value as the first refresh address; and
a communication channel coupled between the controller and the memory and configured to transmit the command signal, the first refresh address, and the second refresh address.

6. The memory system according to claim 5, wherein the hidden auto refresh command is performed by commanding a row active-precharge operation.

7. The memory system according to claim 5, wherein the controller and the memory comprise refresh address counting logics configured in the same manner.

8. The memory system according to claim 5, wherein the controller provides the first refresh address to the memory before a self refresh entry command included in the self refresh command is provided.

9. The memory system according to claim 5, wherein the memory provides the second refresh address to the controller in response to a self refresh exit command included in the self refresh command.

10. The memory system according to claim 5, wherein the controller provides the address synchronization command and the first refresh address to the memory.

11. The memory system according to claim 5, wherein the memory comprises:
a unit memory block;
a refresh address counter configured to count the second refresh address in response to an internal command signal, and update the second refresh address so that the refresh address has the same value as the first refresh address; and
a control unit configured to generate the internal command signal by decoding the command signal, provide the first refresh address to the refresh address counter, and provide the second refresh address to the controller.

12. The memory system according to claim 11, wherein the refresh address counter comprises:
a plurality of counters configured to operate according to different counting methods and generate a plurality of pre-address signals;
a demultiplexer configured to provide the refresh command to any one of the counters in response to a select signal; and
a multiplexer configured to select one of the pre-address signals in response to the select signal and output the selected signal as the second refresh address,
wherein the refresh command comprises one or more of the hidden auto refresh command and the self refresh command.

13. The memory system according to claim 12, wherein each of the counters comprises:
a counting logic configured to receive the refresh command and a reset signal and generate unit count signals; and
an address synchronization section configured to provide the unit count signals or the first refresh address to the counting logic and simultaneously output the unit count signals or the first refresh address as one of the pre-address signals, in response to the address synchronization command.

14. The memory system according to claim 12, wherein each of the counters comprises:
a logic gate configured to generate a reset signal in response to a reset bar signal and an address synchronization bar command;
a counting logic configured to receive initial value bar information in response to the reset signal, and generate the pre-address signal by counting the initial value bar information in response to the refresh command; and
an address synchronization section configured to invert one of initial value information and the first refresh address in response to the address synchronization command and output the inverted signal as the initial value bar information.

15. A memory system comprising:
a memory comprising a plurality of unit memory blocks allocated to a plurality of refresh address counters so as to be in one-to-one correspondence and configured to perform a refresh operation on the plurality of unit memory blocks in response to a hidden auto refresh command; and
a controller configured to count a plurality of refresh addresses corresponding to the plurality of refresh address counters and provide the refresh addresses and the hidden auto refresh command to the memory,
wherein, the controller is configured to update a value of a first refresh address to a same value of a second refresh address, and provide the first refresh address to the memory before starting the refresh operation of the memory, and
the memory is configured to provide the second refresh address changed its value by completion of the refresh operation.

16. The memory system according to claim 15, wherein the hidden auto refresh command is performed by commanding a row active-precharge command.

17. The memory system according to claim 15, wherein the controller is configured to provide the first refresh address thereof to the memory before a self refresh entry command is provided.

18. The memory system according to claim 15, wherein memory is configured to provide the first refresh address thereof to the controller in response to a self refresh exit command provided by the controller.

19. The memory system according to claim 15, wherein each of the refresh address counters comprises:
a plurality of counters configured to operate according to different counting methods and generate a plurality of pre-address signals;
a demultiplexer configured to provide the refresh command to any one of the counters in response to a select signal; and
a multiplexer configured to select one of the pre-address signals in response to the select signal and output the selected signal as the second refresh address, wherein the refresh command comprises one or more of the hidden auto refresh command and the self refresh command.

20. The memory system according to claim 19, wherein each of the counters comprises:
   a counting logic configured to receive the refresh command and a reset signal and generate unit count signals; and
   an address synchronization section configured to provide the unit count signals or the first refresh address provided by the controller to the counting logic and simultaneously output the unit count signals or the refresh address as one of the pre-address signals, in response to the address synchronization command.

21. The memory system according to claim 19, wherein each of the counters comprises:
   a logic gate configured to generate a reset signal in response to a reset bar signal and an address synchronization bar command;
   a counting logic configured to receive initial value bar information in response to the reset signal, and generate the pre-address signal by counting the initial value bar information in response to the refresh command; and
   an address synchronization section configured to invert one of initial value information and the first refresh address provided by the controller in response to the address synchronization command and output the inverted signal as the initial value bar information.

22. A memory system comprising:
   a memory comprising a plurality of unit memory blocks sharing one refresh address counter and configured to perform a refresh operation on the plurality of unit memory blocks in response to a hidden auto refresh command or a self refresh command; and
   a controller configured to provide the hidden auto refresh command or the self refresh command to the memory, and adjust refresh addresses corresponding to the respective unit memory blocks to the same value while the hidden auto refresh command is provided,
   wherein, the controller is configured to update a value of a first refresh address to a same value of a second refresh address, and provide the first refresh address to the memory before starting the refresh operation of the memory, and
   the memory is configured to provide the second refresh address changed its value by completion of the refresh operation.

23. The memory system according to claim 22, wherein the hidden auto refresh command is performed by commanding a row active-precharge operation.

24. The memory system according to claim 22, wherein the controller is configured to provide the refresh addresses adjusted to the same value to the memory before the self refresh command is provided.

25. The memory system according to claim 22, wherein the memory is configured to provide the second refresh address changed by performing a refresh operation in response to the self refresh command, to the controller.

26. The memory system according to claim 22, wherein the refresh address counter comprises:
   a plurality of counters configured to operate according to different counting methods and generate a plurality of pre-address signals;
   a demultiplexer configured to provide a refresh command to any one of the counters in response to a select signal; and
   a multiplexer configured to select one of the pre-address signals in response to the select signal, and output the selected signal as the second refresh address, and the refresh command comprises one or more of the hidden auto refresh command and the self refresh command.

* * * * *